United States Patent [19]

Simon

[11] 4,075,452
[45] Feb. 21, 1978

[54] ELECTRORESISTOR AND METHOD OF MAKING SAME

[75] Inventor: Paul René Simon, Nice, France

[73] Assignee: Societe Francaise de l'Electro-Resistance, Nice, France

[21] Appl. No.: 730,690

[22] Filed: Oct. 7, 1976

[30] Foreign Application Priority Data

Aug. 6, 1976 France .................................. 76 17269

[51] Int. Cl.² .............................................. B23K 15/00
[52] U.S. Cl. ................................ 219/121 EM; 29/620; 29/576 B; 29/578; 156/625; 156/627
[58] Field of Search ............. 29/625, 620, 155, 576 B, 29/578, 579; 219/121 L, 121 LM, 121 ED, 121 EM, 121 R; 156/625, 627

[56] References Cited

U.S. PATENT DOCUMENTS

| B 346,210 | 1/1975 | Ennis | 219/121 LM |
|---|---|---|---|
| 3,431,640 | 3/1969 | Larsson | 29/620 |
| 3,663,224 | 5/1972 | Hallman et al. | 29/620 |
| 3,758,745 | 9/1973 | Wilker | 219/121 LM |
| 3,805,210 | 4/1974 | Croset et al. | 29/620 X |
| 3,846,166 | 11/1974 | Saiki et al. | 29/625 X |
| 3,851,293 | 11/1974 | Clayton | 29/620 |
| 3,851,382 | 12/1974 | Stork | 219/121 EM X |
| 3,860,783 | 1/1975 | Schmidt et al. | 219/121 EM |
| 3,988,564 | 10/1976 | Garvin et al. | 219/121 EM |

OTHER PUBLICATIONS

IBM – vol. 16, #4, 9/1973, "Fabricating Small Interconnection Structures."

*Primary Examiner*—J. V. Truhe
*Assistant Examiner*—Mark Paschall
*Attorney, Agent, or Firm*—Lane, Aitken, Dunner & Ziems

[57] ABSTRACT

A process for producing high precision electrical resistance elements and electrical resistance elements produced thereby are disclosed. The process includes the step of etching a masked metallic layer bonded to an electrically insulating substrate for a time sufficient to etch away substantially all the masking material and a predetermined portion of the metallic material to produce a high precision electrical resistance element having a predetermined ohmic value. Preferably, the masking material has an erosion rate under ion bombardment greater than the erosion rate of the metallic layer and the thickness of the masking material is established as a predetermined function of the metallic layer to be etched away.

12 Claims, 7 Drawing Figures

ELECTRORESISTOR AND METHOD OF MAKING SAME

BACKGROUND OF THE INVENTION

This invention relates to a process for manufacturing high precision electrical resistance elements from metallic foils or thin films adhered to an insulating substrate by using an ion beam for etching predetermined amounts of foil from the substrate. The invention also relates to the electrical resistance elements produced according to the manufacturing process of the invention.

There are at least several well-known etching processes for manufacturing electrical resistance elements from metallic layers adhered to insulating substrates. In a typical process, a masking material is applied on the exposed surface of the metallic layer to produce a mask in a masking pattern corresponding to the shape of the connected metallic filaments to be produced by etching away the unmasked metallic layer material. After etching and cleaning, only the connected metallic filaments having a small cross-section remain. By an appropriate choice of a masking pattern, it is possible to obtain relatively long connected filament lengths within a relatively small surface area of the substrate. Correspondingly, a resistance element thus produced has a high ohmic value per unit of substrate surface area. The etching of the unmasked metallic layer is accomplished by chemical or electrochemical etching steps as disclosed, for example, in U.S. Pat. No. 3,174,920, or by an ion beam etching step. The latter process is described, for example, in an article entitled "Masking for Ion Beam Etching" by P. Gloersen, Solid State Technology (April, 1976) pp. 68–73.

There are a number of disadvantages in the prior art etching processes which are overcome by the present invention. The prior art etching processes employ the mask and masking material as a shield to inhibit or prevent etching of the masked portion of the metallic layer material in the basic etching step. Such processes thus require an additional process step, usually involving a chemical bath, to remove the masking material after the basic etching step has been completed, as described, for example, in the Gloersen article. An additional problem of the prior chemical, electrochemical, and ion beam etching processes is that such processes usually require that careful dimensional changes be made to the basic mask and masking pattern in order to change the electrical properties of the resistive elements being produced.

The chemical and electrochemical etching processes, in addition, produce relatively irregular edges on the metallic filaments. Such irregularities adversely affect the electrical properties of the filaments, and make it difficult for those processes to be used to produce large numbers of resistive elements having electrical properties which are uniform within precision tolerances.

A broad objective of the present invention is to overcome these and other disadvantages of the prior art etching processes. In particular, the present invention allows the manufacture of resistive elements with a high ohmic value per unit of substrate surface area in a process having at least the following advantages over the prior art. First, the electrical properties of the resistive elements being manufactured are reproduceable within precision tolerances in large volume manufacture. Second, a separate process step for the removal of the masking material is eliminated. Third, the electrical properties of the resistive elements being manufactured may be customized during manufacture by simple process control without any need to make dimensional changes in the basic mask or masking pattern. These advantages are realized by deviating from the prior art teaching that the purpose of the masking material is to act as a shield to prevent etching of the metal by the basic etching process.

SUMMARY OF THE INVENTION

According to the present invention, the masking material is selected with recognition of the fact that it will, itself, be etched by ion beam bombardment, and, contrary to the art, it is permissible to select a masking material which will etch more rapidly than the underlying metallic layer material. After selection, the masking material is applied to the exposed surface of the metallic layer to produce a pattern corresponding generally to the shape of the connected filaments to be produced by the following ion beam etching step. The thickness of the masking layer is established based upon the relative etching rates for the masking material and the metallic layer material and the thickness of the metallic layer.

An ion beam is then applied to the masked metallic layer until after the masking material has been etched away as a result of the ion beam bombardment. By that time, due to the selection of the masking material and control of its thickness, the exposed metallic layer material in the grooves of the original masking pattern will have also been etched away, leaving connected filaments. Accordingly, a separate process step for removal of the masking material is eliminated. A continued application of the ion beam to the connected metallic filaments then results in further etching, producing progressively smaller filament cross sections. In a preferred embodiment, the ion beam etching is continued until the electrical resistance element being manufactured has the desired electrical properties and ohmic value. Depending upon the tolerances required, an ion beam source shutoff can be controlled by a simple timer or by means for sensing the electrical properties of the resistance element being manufactured. The process also allows electrical resistance elements, having a wide range of electrical properties and ohmic values, to be manufactured from a single basic mask pattern and allows the electrical properties to be customized during manufacture by a simple controller for the ion beam source shutoff.

The resistive elements produced by the process are also novel in that it is possible to produce higher ohmic values per unit substrate surface area than with prior art processes and in that the entire convex exterior surfaces of the metallic filaments forming each resistive element have been formed by ion beam bombardment. Such resistive elements may be used as high precision resistors in a number of applications including, for example, the manufacture of a strain gage, as is known to the art.

BRIEF DESCRIPTION OF THE DRAWINGS

Further features and advantages of the invention will become apparent from the following detailed description taken together with the drawings, in which.

DETAILED DESCRIPTION OF THE PREFERRED EMBODIMENT

Figure 1:
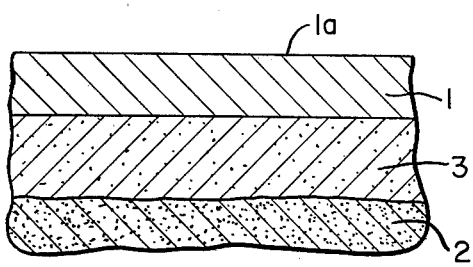
FIG. 1 is a cross sectional view of a layer of metallic material adhered to an insulating support or substrate.

In FIG. 1, an electrically conductive, preferably metallic, material 1 is adhered to an electrically insulating support or substrate material 2 by means of a suitable bonding material 3 and forms a metallic layer 1. In a preferred embodiment, the metallic material 1 is a foil made from an alloy of about 80% nickel and 20% chromium, the insulating support or substrate 2 is a ceramic and the bonding material is a commercially available epoxy glue, for example, from Dow Chemical Company, or a suitable thermosetting resin. The nickel-chromium foil used in a preferred embodiment typically has a thickness equal to only a few microns. Other electrically conductive metals or metal alloys, such as nickel or platinum, may also be used for the metallic material 1 and other electrically insulating materials, such as glass, may be used to form the insulating support or substrate 2. The bonding material 3 may not always be necessary as, for example, when the metallic material 1 is formed into a metallic layer 1 directly on the surface of the insulating support or substrate by means of electrodeposition or vacuum evaporation. The exposed surface of the metallic layer is designated by the reference numeral 1a.

Figure 2:
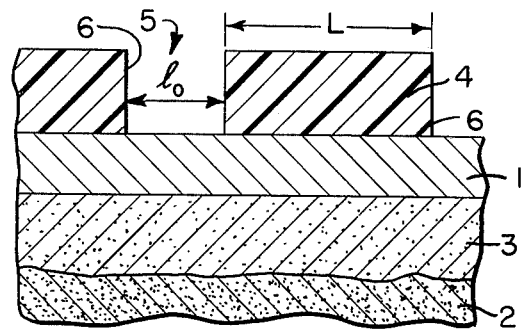
FIG. 2 is a cross sectional view of a layer of metallic material adhered to an insulating support or substrate with masking material defining a filament width applied to the exposed surface of the metallic layer.

In FIG. 2 a masking material 4 is shown, in a cross sectional view, applied to the exposed surface 1a of the metallic layer 1 which is adhered to the insulating support 2 by means of the bonding material 3. The edges 6 of the masking material define a plurality of grooves 5 having an initial width $l_0$ exposing the metallic layer 1 thereunder.

Figure 3:
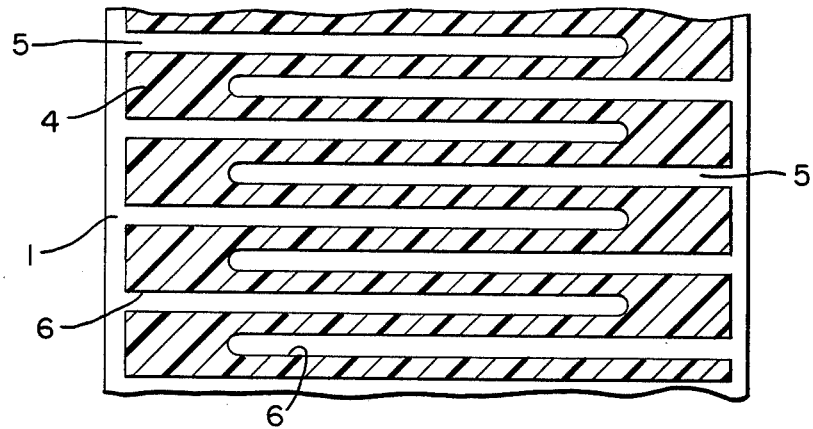
FIG. 3 is a plan view showing the masking material applied to form a masking pattern to the exposed surface of the metallic layer of FIGS. 1 and 2.

In FIG. 3, the masking material 4 is shown, in plan view, applied to the exposed surface of the metallic layer 1 to form a mask 4 covering part of the exposed surface of the metallic layer 1. The edges 6 of the mask define grooves 5 in the mask pattern and the portion of the metallic layer material not covered by the mask is exposed in the grooves 5. The mask 4 has a plurality of closely spaced grooves 5. The edges 6 of the mask 4 correspond generally to the width, edge contour, and pattern of connected filaments of the electrical resistance element to be etched in the metallic layer 1.

The masking material 4 in the mask preferably includes a photosensitive resist compound, for example, as described in U.S. Pat. No. 3,046,120, which compound is one of several which are commercial available and suitable for this purpose. Other masking compounds well known in the art may also be used as commercially available positive and negative photosensitive materials. It is not necessary that masking material 4 be selected for a low etching (erosion) rate relative to the etching (erosion) rate for the metallic layer material 1 under ion beam bombardment; furthermore, it is permissible to select a masking material 4 with a faster etching (erosion) rate than for the metallic layer material 1. In a preferred embodiment, Shipley Series AZ1350 and AZ1317 positive photoresists are selected for the masking material. Those materials have an etching rate which is faster than the metallic layer material 1, when the material is a nickel-chromium 80–20% alloy.

Figure 4:
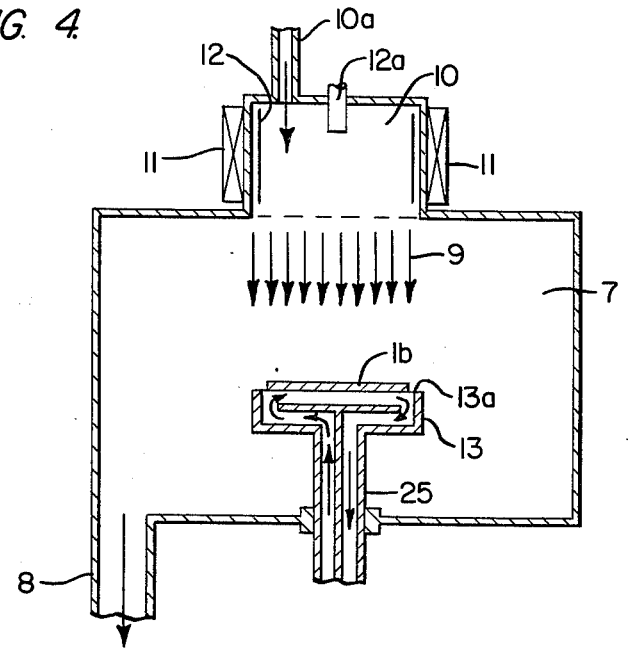
FIG. 4 is a diagram of the ion beam apparatus used to perform the ion beam bombardment step in the process according to the invention.

In FIG. 4, a target 1b, comprising the assembly of the masked metallic layer adhered to the insulating substrate of FIGS. 2 and 3, is exposed to an ion beam 9 in an ion beam apparatus. The masked metallic layer face of the target 1b is principally exposed to the beam. The ion beam 9 includes ions having kinetic energies superior to the liaison energies of the molecules constituting the masked material 4 (see FIGS. 2 and 3) in the target 1b. The ion beam apparatus includes a vacuum chamber 7 connected by conduits 8 to a vacuum pump (not shown). The apparatus also includes an ionization chamber and acceleration chamber 10 for producing the ion beam 9. This chamber may be of the type which is well-known and which is described by Koffman, "Technology of Electron Bombardment Ion Thrusters," Advances in Electronics and Electron Physics, Vol. 36 (1975) p. 267 or in the Gloersen article mentioned above. In operation, an ionizable gas is introduced into the ionization chamber 10 through a conduit 10a. Ionization of the gas occurs in between a cylindrical anode 12 and a filament 12a which emits electrons and in a constant magnetic field having an intensity on the order of a few tens of gauss produced by inductive coil 11.

The vacuum chamber 7 also includes a target holder 13 having a surface 13a exposed to the ion beam 9 and preferably mounted substantially perpendicularly to it. The target 1b is mounted on the target holder 13. The target holder is rotatably mounted about the axis of the ion beam 9 so that depending upon the ion beam 9 characteristics, the rotation may produce a more uniform etching. The apparatus also includes an interior passageway in the target holder 13 for circulation of a coolant, as shown diagrammatically by the reference arrow 25.

Figure 5:
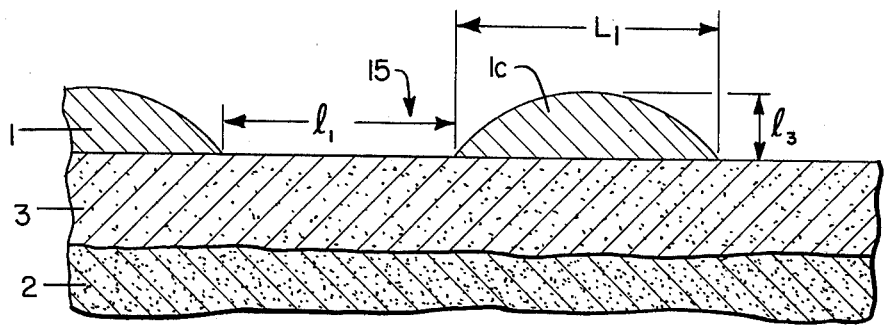
FIG. 5 is a cross sectional view of the metallic layer adhered to the substrate after the ion beam bombardment step in the process according to the invention has been completed.

The effect of the ion beam 9 on the target 1b is to produce etching (erosion) of the mask mateial 4 and the metallic layer material 1. FIG. 5 shows, in cross section, the target 1b after the mask material 4 has been completely etched away by bombardment by the ion beam 9.

In a preferred embodiment, argon gas is used in the ion beam apparatus of FIG. 4 to form $Ar^+$ ions having average kinetic energies in the range of about 1 KeV to about 2 KeV and producing ionic current densities in the range of about 0.5 mA/cm$^2$ to about 1.5 mA/cm$^2$ at the surface of the target 1b. The vacuum used is in the range of $10^{-7}$ torr of nitrogen pressure. With these ion beam apparatus parameters, the etching or erosion rate for the mask material 4 (Shipley Series AZ1350) is approximately 4.5 A/sec and for the nickel-chromium 80%–20% alloy metallic layer material is approximately 2.7 A/sec.

According to the process of the invention, the mask 4 and the metallic layer 1 are subjected to the action of the ion beam 9 for a predetermined time corresponding to the elimination of the mask 4 and the metallic layer material in the grooves 5 in the mask pattern. This occurs from an appropriate selection of the thickness of the mask material 4 in view of the relative etching erosion rates of the mask material 4 and the metallic layer material 1 and the thickness of the metallic layer 1 before etching. Preferably, the ion beam 9 is continued to be applied to the target 1b even after the mask 4 has been etched or eroded away and for an additional length of time sufficient to cause the connected metallic filaments formed in the etched metallic layer to achieve the desired ohmic value.

In FIG. 5, the result according to the invention is shown in cross sectional view. The mask 4 has been completely removed by etching or erosion and all that remains are the rounded filaments 1c of the metallic layer having a width $L_1$ and a thickness $l_3$ 15 having a width $l_1$. Generally, the width of the grooves 15 after etching or erosion (shown by $l_1$ in FIG. 5) will be greater than the width of the grooves 5 in the mask 4 before etching (shown in $l_0$ in FIG. 2).

Figure 6:
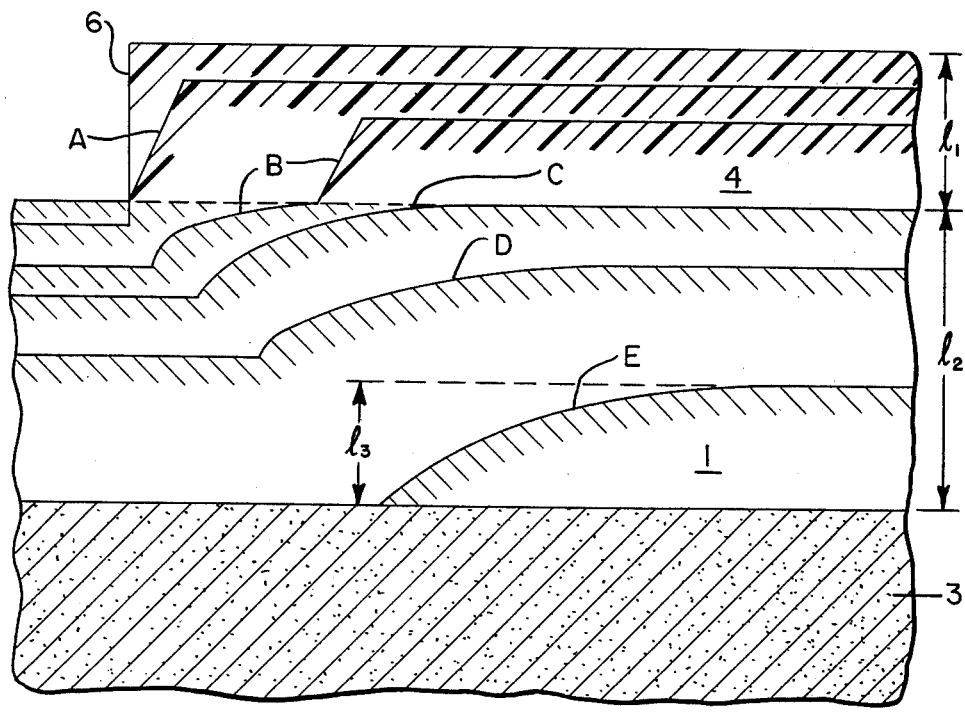
FIG. 6 is a cross sectional, diagrammatic view showing the evolution with time of the etching of the mask material and the metallic layer material under ion beam bombardment according to the process of the invention.

FIG. 6 is a cross-sectional, diagrammatic view, showing the evolution with time of the etching of the mask material 4 and the metallic layer material 1 under bombardment of the ion beam 9. The evolution depicted progresses from that shown by a cross section through FIG. 2 to that shown by a cross section through FIG. 5. In FIG. 6, the mask material 4 has an edge 6 prior to application of the ion beam 9.

By way of specific examples, the initial thickness $l_1$ of the mask material 4 (Shipley Series AZ1350) was 1.3 microns and the initial thickness $l_2$ of the metallic layer material 1 (nickel-chromium 80%-20% alloy) was 2.5 microns. The ion beam 9 used $Ar^+$ ions having average kinetic energies of 1 KeV which produced ionic current densities of 0.6 mA/cm$^2$ at the target surface 1b. The vacuum in the ion beam apparatus was approximately $10^{-7}$ torr of nitrogen pressure. With these process parameters, lines A, B, C, D, and E in FIG. 6 represent the target surface as it is etched away under the influence of ion beam bombardment for the indicated durations.

| Line in FIG. 6 | Duration of Exposure to Ion Beam (Sec.) |
|---|---|
| A | 676 |
| B | 1000 |
| C | 2955 ($t_1$) |
| D | 5000 |
| E | 9200 ($t_2$) |

From inspection of FIG. 6, it is seen that line C corresponds to the duration time, $t_1$, at which all of the mask material 4 has just been removed by etching (erosion). Similarly, line E corresponds to the duration time, $t_2$, at which all of the metallic layer material in groove 5 has just been removed by etching. After application of the ion beam for the duration time, $t_2$, the metallic filament 1c obtained will have a maximum thickness of approximately 1 micron.

As a further example of the process, the following table represents experimental results for the variation of $t_1$ and maximum thickness of metallic filament 1a with initial thickness of 2.5 microns at $t_2$ as a function of the initial thickness of the mask 4, all other process parameters being the same as in the prior example:

| Initial Thickness of Mask 4 | $t_1$ (Sec) | $t_2$ (Sec) | Maximum Thickness of Filament 1c at $t_2$ |
|---|---|---|---|
| 2 microns | 4545 | 9200 | 1.5 microns |
| 3 microns | 6818 | 9200 | 1.9 microns |

It is, accordingly, possible using the materials and the process parameters in the preferred embodiment to control the maximum thickness of metallic filament 1c at time $t_2$ by controlling the original thickness of the mask 4.

Of course, by controlling the maximum thickness of filament 1c, one controls the cross-sectional area of the metallic filament 1c which is inversely proportional to the ohmic value of the resistive element being manufactured. By continued application of the ion beam after time $t_2$, additional etching (erosion) occurs on the metallic filament 1c, further reducing the cross-sectional area. From the foregoing, it is seen that a single basic mask pattern 4 may be used to produce a multiplicity of resistive elements having widely ranging ohmic values merely by controlling the original thickness of the mask material 4 and the duration of application of the ion beam 9.

Figure 7:
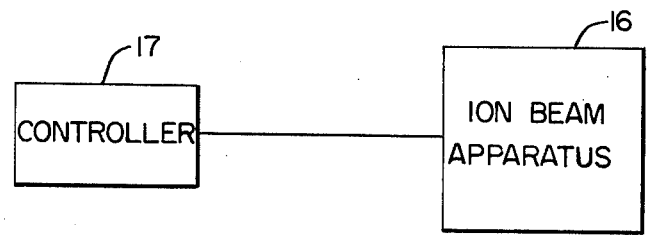
FIG. 7 is a schematic diagram of the ion beam apparatus of FIG. 4 controlled by a controller.

Depending upon the precision tolerances required, the duration of application of the ion beam 9 in the ion beam apparatus 16 in FIG. 7, can be controlled by a simple controller 17 (in FIG. 7) such as a timer or means for sensing the ohmic value of the resistive element being formed. Such a controller 17 shuts off the ion beam 9 in the ion beam apparatus 16 when the desired ohmic value has been attained for the resistance element being formed.

As a further example, consider the same process parameters as in the prior examples except for an initial metallic layer 1 thickness of 2.5 microns and an initial mask 4 thickness of 1.5 microns. Consider further, a groove 5 width of 6 microns, with the grooves 5 being separated initially by masking material 4 having a width of 14 microns. After bombardment by the ion beam 9 until the maximum thickness of the filament 1a is 1 micron, the groove width between the filaments 1a will be approximately 9 microns. Thus, an electrical resistance element having 204 parallel, connected filaments 1a, each being about 5.4 mm in length, will have an ohmic value of approximately 130 K ohms.

The electrical resistance elements produced according to the process of the invention present a cross section with a round and convex profile, the convexity being toward the exterior of the resistive element, and in which the entire or substantially the entire exterior surface of the resistive element has been formed by ion beam 9 etching. Experimental results have shown that such resistive elements have ohmic values per unit surface area larger than those obtained from prior art etching processes. This result can be explained by the fact that the grooves 15 are sometimes larger than the grooves 5, and that the cross sections of the filaments 1c are convex toward the exterior.

Resistors produced according to the invention are used in a number of applications, for example, in strain gages, which require precision resistors having a high stability.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. A process for the manufacture of a high precision electrical resistance element comprising:

applying a metallic material having a predetermined thickness to an insulating support material to form a metallic layer adhering to said insulating support material;

applying a masking material having a predetermined thickness to the exposed surface of said metallic layer to form a mask having edges corresponding generally to the contour of the electrical resistance element to be formed and to form exposed areas and masked areas on the outer surface of said metallic layer, the thickness of the masking material being determined relative to the thickness of the metallic material as a function of their respective erosion rates under ion bombardment; and applying to said masked metallic layer an ion beam at least until the masking material has been etched away as a result of bombardment by said ion and the exposed areas of said metallic layer have been etched away as a result of bombardment by said ion beam, wherein at least a portion of the masked areas of said metallic layer are also at least slightly etched after complete erosion of said masking material thereover.

2. The process according to claim 1 in which the application of the ion beam is continued until a resistance element of the required ohmic value has been obtained.

3. The process according to claim 1 in which the rate of erosion of the masking material is greater than the rate of erosion of the metallic layer material under bombardment of the ion beam and the thickness of the masking material is selected relative to the thickness of the metallic layer sufficient that, upon bombardment, at least all of said masking material has been etched away while forming a high precision electrical resistance element from said metallic layer.

4. The process according to claim 1 in which the average kinetic energy of the ions in the ion beam exceeds the liaison energy of the molecules constituting the masking material and the metallic layer material.

5. The process according to claim 1 in which the ion beam comprises positive argon ions having average kinetic energies of in the range of 1 KeV to 2 KeV and producing ionic current densities at the surface of said masked metallic layer in the range of 0.5 mA/cm$^2$ to 1.5 mA/cm$^2$.

6. The process according to claim 1 in which the thickness of the mask is established as a predetermined function of the amount of the metallic layer material to be etched away as a result of bombardment by the ion beam after said masking material has been etched away.

7. The process according to claim 1 in which the duration of application of the ion beam is controlled by a timer.

8. The process according to claim 1 in which the duration of application of the ion beam is controlled by means for sensing the ohmic value of the electrical resistance element being formed.

9. As a new article of manufacture, an electrical resistance element formed by:

applying a metallic material having a predetermined thickness to an insulating support material to form a metallic layer adhering to said insulating support material;

applying a masking material having a predetermined thickness to the outer surface of said metallic layer to form a mask having edges corresponding generally to the contour of the electrical resistance element to be formed and to form exposed areas and masked areas on the outer surface of said metallic layer, the thickness of the masking material being determined relative to the thickness of the metallic material as a function of their respective erosion rates under ion bombardment; and applying to said masked metallic layer an ion beam at least until the masking material has been etched away as a result of bombardment by said ion beam and the exposed areas of said metallic layer have been etched away as a result of bombardment by said ion beam, wherein the cross section of said electrical resistance element includes a convex profile, the convexity being toward the exterior, and wherein the entire exterior surface of said electrical resistance element has been formed by ion beam bombardment.

10. An electrical resistance element comprising:

an electrically-insulating support member; and an electrically-conducting material adhered to said support member and defining a pattern of open portions and shaped portions in a predetermined configuration to develop a resistive path through said shaped portions, said shaped portions having a cross-section contoured at least in part and produced by the effect of erosion caused by an ion bombardment on a cross section having an initial configuration wherein at least a portion of the outer surface of said shaped portion of said electrically-conducting material is also at least partially eroded by said ion beam.

11. The element as defined in claim 10 wherein said cross section includes a convex profile, the convexity being toward the exterior of said element and the entire exterior surface of said element is formed by ion beam bombardment.

12. In a process for producing a high precision electrical resistance element by the effect of a beam of ions having a known average kinetic energy to produce a determinable etching effect at a target area at which is located a target array comprising an electrically conductive metallic layer secured to an electrically insulating substrate wherein the layer is masked with a masking material to define a pattern having a contour corresponding generally to the electrical resistance element produced and grooves therein; the improvement comprising:

applying to said metallic layer a masking material having an erosion rate greater than the erosion rate of said metallic layer under like conditions of ion bombardment and having a thickness which is a function of the erosion rates of said masking material and said metallic and the thickness of said metallic layer sufficient that, upon ion bombardment, said masking material is completely eroded prior to the complete erosion of said metallic layer in the grooves defined by said masking material.

* * * * *

UNITED STATES PATENT OFFICE
CERTIFICATE OF CORRECTION

Patent No. 4,075,452    Dated February 21, 1978

Inventor(s) PAUL R. SIMON

It is certified that error appears in the above-identified patent and that said Letters Patent are hereby corrected as shown below:

Column 3, line 6, "FIG. 5" should be the start of a new paragraph;

Column 5, line 14, after "thickness $l_3$", -- separated by grooves -- should be inserted; and Column 8, line 59, "and said metallic" should have been deleted.

Signed and Sealed this

Twenty-fourth Day of October 1978

[SEAL]

Attest:

RUTH C. MASON
Attesting Officer

DONALD W. BANNER
Commissioner of Patents and Trademarks

UNITED STATES PATENT AND TRADEMARK OFFICE
CERTIFICATE OF CORRECTION

PATENT NO. : 4,075,452
DATED : February 21, 1978
INVENTOR(S) : PAUL R. SIMON

It is certified that error appears in the above—identified patent and that said Letters Patent is hereby corrected as shown below:

On the front page of the patent, line [30], delete "Aug. 6, 1976" and insert therefor -- June 8, 1976 --.

Signed and Sealed this

Nineteenth Day of February 1985

[SEAL]

Attest:

DONALD J. QUIGG

Attesting Officer

Acting Commissioner of Patents and Trademarks